(12) United States Patent
Chi

(10) Patent No.: US 12,236,141 B2
(45) Date of Patent: *Feb. 25, 2025

(54) MEMORY CIRCUIT AND MEMORY

(71) Applicant: CHANGXIN MEMORY TECHNOLOGIES, INC., Hefei (CN)

(72) Inventor: Sungsoo Chi, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 252 days.

This patent is subject to a terminal disclaimer.

(21) Appl. No.: 17/858,406

(22) Filed: Jul. 6, 2022

(65) Prior Publication Data
US 2023/0083020 A1    Mar. 16, 2023

Related U.S. Application Data

(63) Continuation of application No. PCT/CN2022/087420, filed on Apr. 18, 2022.

(30) Foreign Application Priority Data

Sep. 13, 2021    (CN) .......................... 202111068860.5

(51) Int. Cl.
  *G11C 5/02*     (2006.01)
  *G06F 3/06*     (2006.01)
  *G11C 8/12*     (2006.01)
  *G11C 11/408*   (2006.01)

(52) U.S. Cl.
  CPC .......... *G06F 3/0673* (2013.01); *G06F 3/0604* (2013.01); *G06F 3/0644* (2013.01); *G11C 8/12* (2013.01); *G11C 11/4087* (2013.01)

(58) Field of Classification Search
  CPC .... G06F 3/0673; G06F 3/0604; G06F 3/0644; G11C 8/12; G11C 11/4087
  USPC ...................................... 365/230.03
  See application file for complete search history.

(56) References Cited

U.S. PATENT DOCUMENTS

| 5,317,535 A     | 5/1994 | Talreja |
|-----------------|--------|---------|
| 6,233,196 B1 *  | 5/2001 | Lee .......................... G11C 8/12 |
|                 |        |         365/230.03 |
| 9,934,827 B2    | 4/2018 | Wu |
| 2008/0112251 A1*| 5/2008 | Youn ...................... G11C 5/025 |
|                 |        |         365/230.03 |
| 2021/0173559 A1 | 6/2021 | Nishikawa et al. |

FOREIGN PATENT DOCUMENTS

CN    112712831 A    4/2021

* cited by examiner

*Primary Examiner* — Huan Hoang
(74) *Attorney, Agent, or Firm* — Syncoda LLC; Feng Ma

(57) ABSTRACT

A memory circuit at least includes a plurality of memory banks, where each of the memory banks includes a first memory sub-bank, a second memory sub-bank and a third memory sub-bank sequentially arranged, the second memory sub-bank including a first memory section and a second memory section, the first memory sub-bank and the second memory section being configured to store upper bytes, and the first memory section and the third memory sub-bank being configured to store lower bytes.

15 Claims, 4 Drawing Sheets

FIG. 2

MEMORY CIRCUIT AND MEMORY

CROSS-REFERENCE TO RELATED APPLICATION

This application is a continuation of International Application No. PCT/CN2022/087420 filed on Apr. 18, 2022, which claims priority to Chinese Patent Application No. 202111068860.5 filed on Sep. 13, 2021. The disclosures of these applications are hereby incorporated by reference in their entirety.

BACKGROUND

As a high-speed and large-capacity data storage carrier, a dynamic random access memory (DRAM) is an essential part of most electronic systems. The minimum memory cell in the DRAM includes a capacitor and a transistor. The operation mechanism of the DRAM is divided into read and write. During the read operation, the bit line (BL) is first charged to half of a operation voltage (VDD/2), and then the transistor is turned on through the word line (WL), so that the phenomenon of charge sharing between the capacitor and the bit line can be generated. If the internal storage the capacitor has a value of 1, the voltage of the bit line will be pulled up to greater than the half of the operation voltage by the charge sharing. If the internal storage of the capacitor has a value of 0, the voltage of the bit line will be pulled down to less than the half of the operation voltage. After the voltage of the bit line is obtained, the voltage of the bit line needs to be amplified by an amplifier, to determine the value of the internal storage of the capacitor. During the write operation, the transistor is controlled to be turned on by the word line, if 1 is required to be written, the voltage of the bit line is pulled up to the operation voltage to enable the capacitor to store the corresponding charges, and if 0 is required to be written, the voltage of the bit line is pulled down to the low level to discharge the charges in the capacitor.

SUMMARY

Embodiments of the present disclosure relate to, but are not limited to, a memory circuit and a memory.

According to some embodiments of the present disclosure, an aspect of the embodiments of the present disclosure provides a memory circuit including multiple memory banks, where each of the memory banks includes a first memory sub-bank, a second memory sub-bank and a third memory sub-bank sequentially arranged, the second memory sub-bank including a first memory section and a second memory section, the first memory sub-bank and the second memory section being configured to store upper bytes, and the first memory section and the third memory sub-bank being configured to store lower bytes.

According to some embodiments of the present disclosure, another aspect of the embodiments of the present disclosure further provides a memory including a memory circuit. The memory circuit includes multiple memory banks, where each of the memory banks includes a first memory sub-bank, a second memory sub-bank and a third memory sub-bank sequentially arranged, the second memory sub-bank including a first memory section and a second memory section, the first memory sub-bank and the second memory section being configured to store upper bytes, and the first memory section and the third memory sub-bank being configured to store lower bytes.

BRIEF DESCRIPTION OF THE DRAWINGS

One or more embodiments are exemplified by the figures in the accompanying drawings corresponding thereto, which are not intended to be limiting of the pairwise embodiment, unless specifically stated, the figures in the drawings do not constitute a scale limitation.

FIG. 1 to FIG. 4 are schematic structural diagrams of memory circuits according to embodiments of the present disclosure.

DETAILED DESCRIPTION

Embodiments of the present disclosure will now be described in detail in conjunction with the accompanying drawings. However, those of ordinary skill in the art will appreciate that, in various embodiments of the present disclosure, many technical details have been proposed to better enable the reader to understand the present disclosure. However, the technical solution claimed in the present disclosure can be implemented without these technical details and various changes and modifications based on the following embodiments.

FIG. 1 to FIG. 4 are schematic structural diagrams of memory circuits according to embodiments of the present disclosure.

Figure 1:
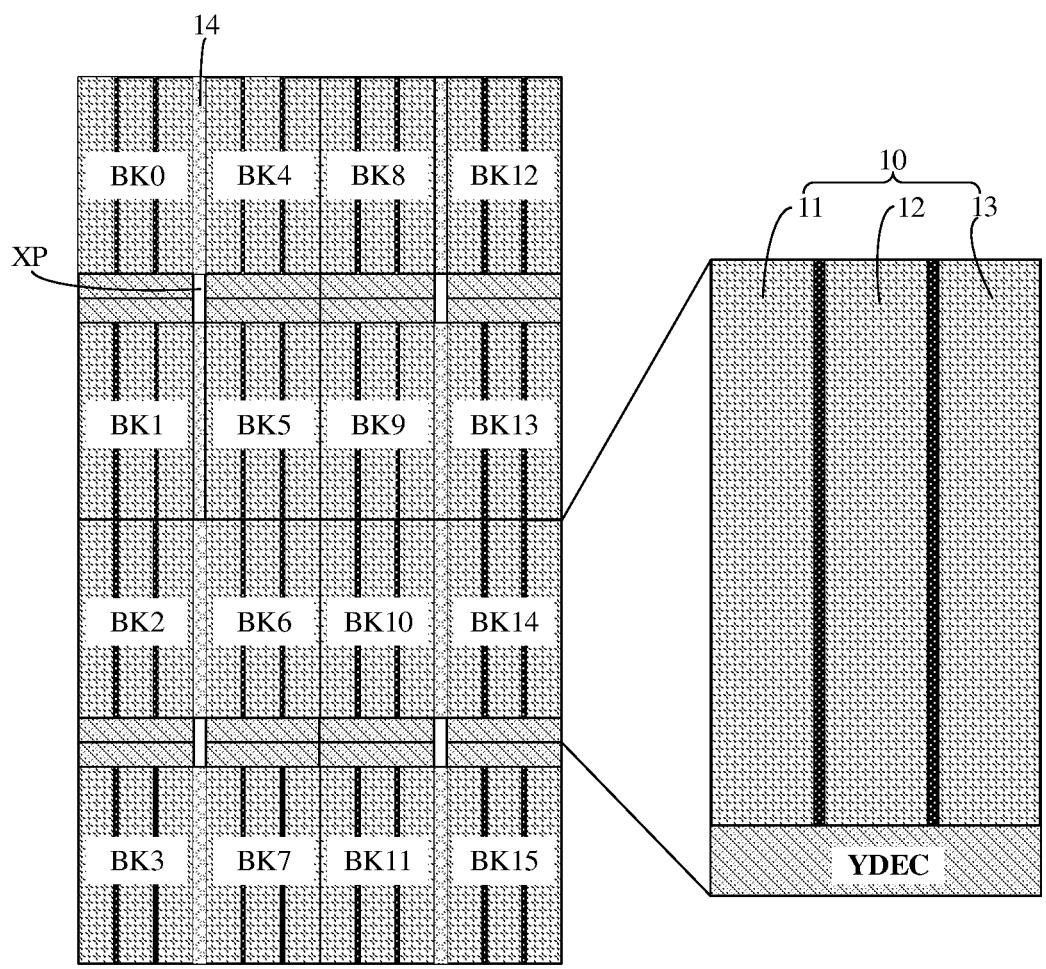
Figure 2:
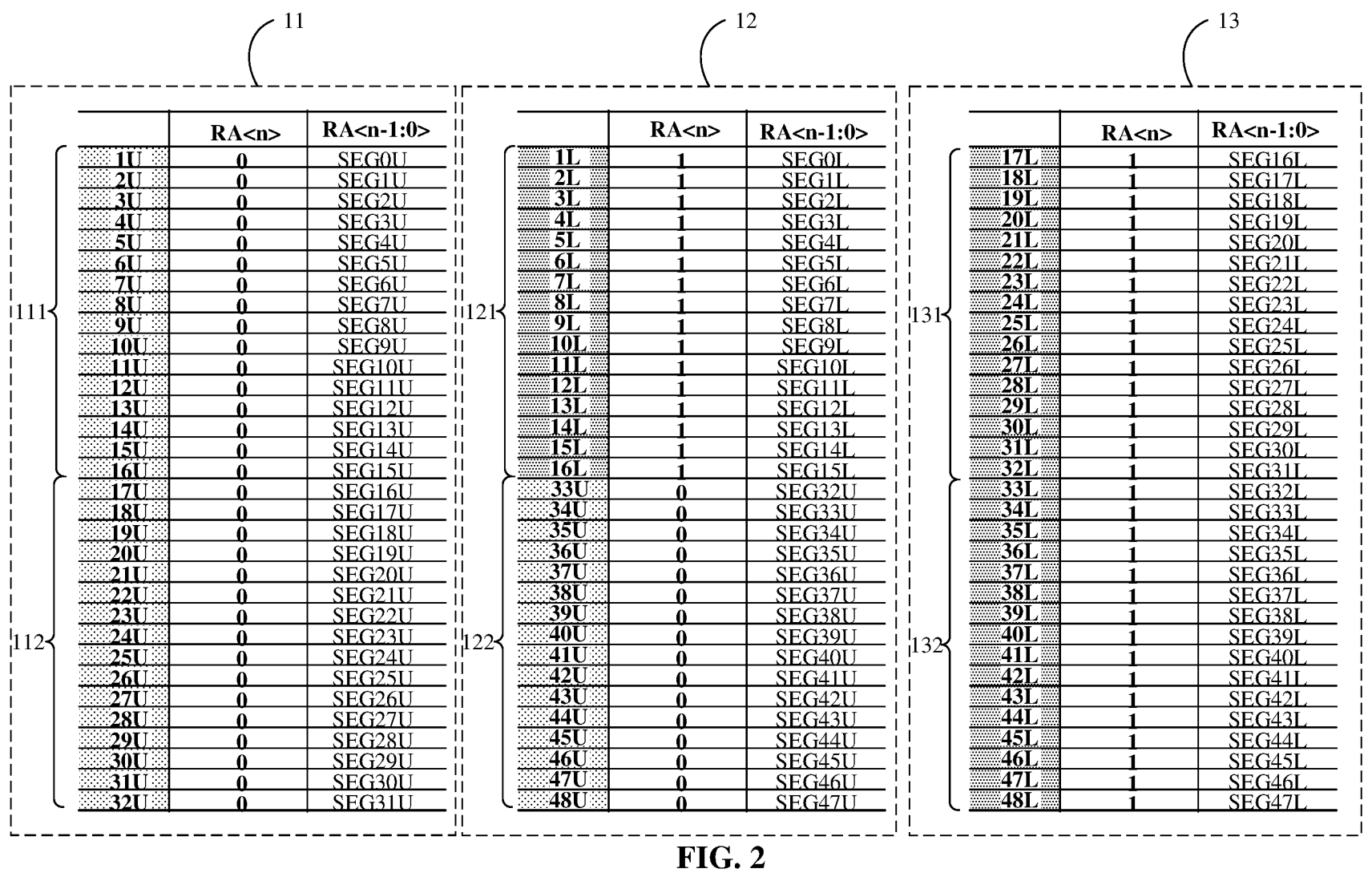

Referring to FIG. 1 to FIG. 2, the memory circuit includes multiple memory banks 10, where each of the memory banks 10 includes a first memory sub-bank 11, a second memory sub-bank 12 and a third memory sub-bank 13 sequentially arranged. The second memory sub-bank 12 includes a first memory section 121 and a second memory section 122. The first memory sub-bank 11 and the second memory section 122 are configured to store upper bytes, and the first memory section 121 and the third memory sub-bank 13 are configured to store lower bytes.

Embodiments of the present disclosure will be described in more detail below in conjunction with the accompanying drawings.

Referring to FIG. 1, the memory circuit may include multiple memory banks 10. As the capacity of the memory circuit changes, the capacities, number, and arrangement of the memory banks 10 will change accordingly. Taking the capacity of the memory circuit being 16 G and the capacity of each memory bank being 1 G as an example, the memory circuit includes sixteen memory banks 10 (BK0~BK15), and the arrangement of the memory banks 10 is 4×4. Furthermore, each memory bank has a corresponding row decoder (not shown) configured to receive a row address signal to activate a corresponding word line, and a column decoder YDEC configured to obtain a readout signal of a bit line of a specific column address. The readout signal is amplified by a sense amplifier and then input into local I/O lines.

It should be noted that the structure of the memory circuit provided in the embodiment of the present disclosure is applicable not only to the capacity of 16 G or less, but also to the capacity of 16 G or more. The adjacent memory banks 10 share the same peripheral circuit region 14 including a decoding circuit connected to a word line driver configured to drive the word lines in the memory banks 10. In a case of an arrangement of 4×4, two peripheral circuit regions 14 are provided in each row. Furthermore, the peripheral circuit area 14 and the column decoder YEDC are located on different sides of the memory bank 10.

In addition, the memory circuit further includes a cross-point region circuit XP disposed between four memory banks 10 (for example, BK0, BK1, BK4, and BK5) adjacent to each other. Structures such as a pull-up drive circuit, a local equalization circuit, an I/O equalization circuit, a precharge circuit, and an equalization drive circuit may be provided in the cross-point region circuit XP. The pull-up drive circuit is configured to supply an operation voltage to a first electrode line to activate the sense amplifier. The local equalization circuit is connected between the first electrode line and the second electrode line in series and configured to connect or disconnect a first electrode line and a second electrode line, and if the first electrode line is connected with the second electrode line, the sense amplifier cannot be activated; the I/O equalization circuit and the precharge circuit are connected in series between a pair of bit lines, the precharge circuit is configured to pull up the voltage of the pair of the bit lines to a half the operation voltage, the I/O equalization circuit is configured to share the charges in the pair of the bit lines, and the equalization drive circuit is configured to activate the I/O equalization circuit and the precharge circuit.

In some embodiments, a number of memory segments in the first memory sub-bank 11 is identical to a number of memory segments in the third memory sub-bank 13, and a number of memory segments in the first memory section 121 is identical to a number of memory segments in the second memory section 122. In this way, it is advantageous to make the number of memory segments storing upper bytes be equal to the number of memory segments storing lower bytes, and ensure that memory banks can effectively store upper bytes and lower bytes having the identical number of bits, thereby avoiding redundancy of memory segments storing upper bytes or lower bytes, and improving utilization of memory banks.

Taking the embodiment shown in FIG. 2 as an example, the first memory sub-bank 1 includes thirty-two memory segments (SEG0U~SEG31U corresponding to 1U~32U), where "U" indicates that the memory segment stores the upper bytes, the third memory sub-bank 13 also includes thirty-two memory segments (SEG16L~SEG47L corresponding to 17 L~48 L), where "L" indicates that the memory segment stores the lower bytes. Accordingly, the first memory section 121 includes sixteen memory segments (SEG0L~SEG15L corresponding to 1L~16 L), and the second memory section 122 also includes sixteen memory segments (SEG32U~SEG47U corresponding to 33U~48U), where "U" indicates that the memory segment stores the upper bytes. It should be noted that as the capacities of the memory circuit and the memory banks change, the number of memory segments included in each memory sub-bank also changes. For example, if the capacity of each memory bank is doubled, the number of memory segments included in each memory sub-bank is doubled.

Furthermore, in a case where the number of the memory segments storing the upper bytes is identical to the number of the memory segments storing the lower bytes, if each of the memory segments includes an identical number of word lines, the number of word lines included in the memory segments storing the upper bytes is identical to the number of word lines included in the memory segments storing the lower bytes. It should be noted that, in different memories, the number of memory cells included in a memory segment may be different from each other. In some embodiments, a sum of the number of memory segments in the first memory section 121 and the number of memory segments in the second memory section 122 is equal to the number of memory segments in the first memory sub-bank, that is to say, the number of memory segments in the first memory sub-bank 11 is identical to the number of memory segments in the the second memory sub-bank 12, and to the number of memory segments in the third memory sub-bank 13.

As shown in FIG. 2, the first memory sub-bank 11, the second memory sub-bank 12 and the third memory sub-bank 13 each include thirty-two memory segments. In other embodiments, a sum of the number of memory segments in the first memory section 121 and the number of memory segments in the second memory section 122 may also be smaller than the number of memory segments in the first memory sub-bank 11. In this way, all memory segments in the second memory sub-bank 12 may also share the row decoder with the memory segments in the first memory sub-bank 11 or the memory segments in the third memory sub-bank 13.

In some embodiments, the logical start address of the memory segments in the first memory sub-bank 11, the logical start address of the memory segments in the second memory sub-bank 12, and the logical start address of the memory segments in the third memory sub-bank 13 are sequentially extended. The logical start address of the memory segments in the second memory section 122 is behind the logical start address of the memory segments in the first memory section 121. Since the physical address of the memory cell in each memory segment is equal to the start address of the segment to which the memory cell belongs plus a offset within the segment, the physical address of the memory cell in the second memory section 122 is behind the physical address of the memory cell in the first memory section 121. The physical addresses of the memory cells in the first memory section sub-bank 11 are not continuous with the physical addresses of the memory cells in the second memory section 122. Accordingly, the physical addresses of the memory cells in the first memory section 121 are not continuous with the physical addresses of the memory cells in the third memory section sub-bank 13.

In some embodiments, the first memory sub-bank 11 includes a third memory section 111 and a fourth memory section 112, and the third memory sub-bank 13 includes a fifth memory section 131 and a sixth memory section 132. The third memory section 111, the first memory section 121 and the fifth memory section 131 are arranged side by side, and the fourth memory section 112, the second memory section 122, and the sixth memory section 132 are arranged side by side. The first memory section includes a number of word lines identical to a number of word lines included in the third memory section, and the second memory section includes a number of word lines identical to a number of word lines included in the sixth memory section. In this way, it is beneficial to make the first memory section 121 and the second memory section 122 share the same row decoder with the memory sections in the memory sub-banks respectively adjacent to the sub-banks where the first memory section 121 and the second memory section 122 disposed.

Furthermore, the number of word lines in the first memory section 121 is identical to the number of word lines in the second memory section 122. The number of word lines in the first memory section 121 is identical to the number of word lines in the third memory section 111 and to the number of word lines in the fifth memory section 131. The number of word lines in the second memory section 122 is identical to the number of word lines in the fourth memory section 112 and to the number of word lines in the sixth memory section 132.

Figure 3:
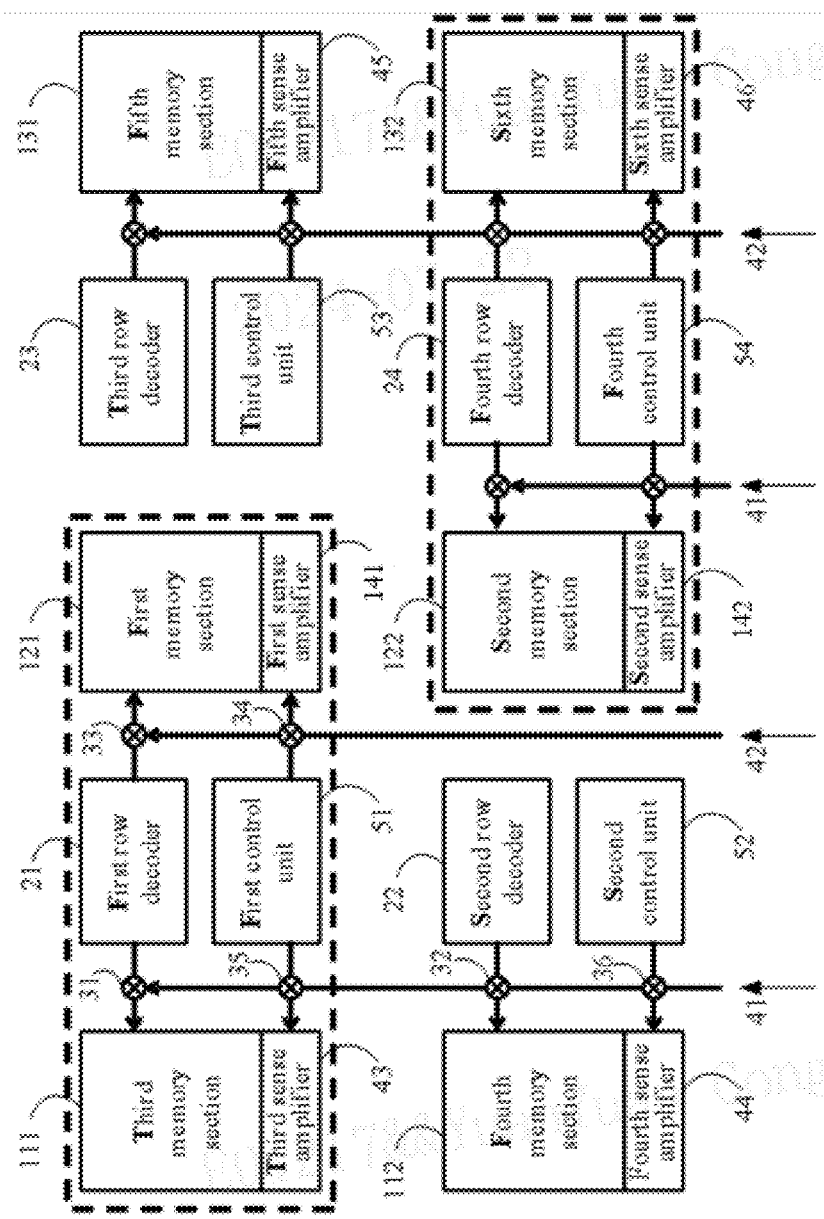

In some embodiments, referring to FIG. 3, the memory circuit includes a first row decoder 21 disposed between the third memory section 111 and the first memory section 121, and a second row decoder 22 disposed between the fourth memory section 112 and the second memory section 122. The first row decoder 21 is configured to activate word lines in the third memory section 111 and the first memory section 121, and the second row decoder 22 is configured to activate word lines in the fourth memory section 112. It is possible to save the circuit area and simplify the memory circuit by using the same row decoder to activate word lines in different memories sub-bank. In addition, the shared row decoder is disposed between the corresponding two memory sections, so that it is advantageous to shorten the connection distance of the circuit, thereby avoiding a long RC delay due to a large resistance of the wires, and improving the readout speed of the memory circuit. Furthermore, the two memory sections sharing the row decoder are configured to store the upper bytes and the lower bytes, respectively, so that it is advantageous to prevent the row decoder from activating an erroneous word line after receiving the row address.

It should be noted that the logical address of the memory segment includes the most significant bit (MSB) and the block selection address, the most significant bit is located in the leftmost bit RA<n> of the row address, and the block selection address is the other bits RA<n−1:0> of the row address. Referring to FIG. 2, the most significant bit of the memory segment storing the upper bytes is 0, the most significant bit of the memory segment storing the lower bytes is 1, the block selection addresses of different memory banks storing the same type of bytes (the upper bytes or the lower bytes) are different, for example, SEG0~SEG47, and the block selection addresses of different memory banks storing the different types of bytes may be the same, for example, all are SEG0~SEG47.

In some embodiments, the memory circuit further includes a first switch circuit 31 configured to connect the first row decoder 21 and the third memory section 111, a second switch circuit 32 configured to connect the second row decoder 22 and the fourth memory section 112, and a third switch circuit 33 configured to connect the first row decoder 21 and the first memory section 121. The first switch circuit 31 and the second switch circuit 32 are configured to receive a first flag signal 41 and be turned on, and the third switch circuit is configured to receive a second flag signal 42 and be turned on. The first flag signal 41 is indicative of reading the upper bytes and the second flag signal 42 is indicative of reading the lower bytes. The switch circuit is connected between the line decoder and the memory section in series to turn on the line decoder and the memory section storing the byte when the corresponding byte is read, so that it is advantageous to prevent the line decoder from activating erroneous word lines, and improve the accuracy of data read by the memory circuit.

In some embodiments, the memory circuit further includes a third row decoder 23 disposed between the fifth memory section 131 and the first memory section 121, a fourth row decoder 24 disposed between the sixth memory section 132 and the second memory section 122. The third row decoder 23 is configured to activate word lines in the fifth memory section 131, and the fourth row decoder 24 is configured to activate word lines in the second memory section 122 and the sixth memory section 132. The switch circuit connected between the third row decoder 23 and the fifth memory section 131 in series is turned on when receiving the second flag signal 42, the switch circuit connected between the fourth row decoder 24 and the sixth memory section 132 in series is turned on when receiving the second flag signal 42, and the switch circuit connected between the fourth row decoder 24 and the second memory section 122 in series is turned on when receiving the first flag signal 41. Similar to the first row decoder 21 and the corresponding switch circuit, the arrangement of the fourth row decoder 24 facilitates to simplify the circuit and improve the readout rate of the memory circuit. In addition, the first row decoder 21 and the fourth row decoder 24 with the similar connection and function are provided simultaneously.

Accordingly, the memory circuit further includes: a first sense amplifier 141 configured to amplify a readout signal of a bit line in the first memory section 121, a second sense amplifier 142 configured to amplify a readout signal of a bit line in the second memory section 122, a third sense amplifier 43 configured to amplify a readout signal of a bit line in the third memory section 111, and a fourth sense amplifier 44 configured to amplify a readout signal of a bit line in the fourth memory section 112; and a first control unit 51 disposed between the first sense amplifier 141 and the third sense amplifier 43, and a second control unit 52 disposed between the second sense amplifier 142 and the fourth sense amplifier 44. The first control unit 51 is configured to control the first sense amplifier 141 and the third sense amplifier, and the second control unit 52 is configured to control the fourth sense amplifier 44. Similarly to the setting of the first row decoder 21, a first control unit is provided to connect two adjacent sense amplifiers and control the two adjacent sense amplifiers, so that it is facilitate to simplify the circuit and shorten the RC delay; and simultaneously, it is possible to make the connection between the first control unit 51 and components adjacent to the first control unit 51 is similar to the connection between the first row decoder 21 and components adjacent to the first row decoder 21, so that it is facilitate to simplify the layout design of the memory circuit.

Each of the first row decoder 21 and the first control unit 51 is disposed between the first memory section 121 and the third memory section 111, and also disposed between the sense amplifier corresponding to the first memory section 121 and the sense amplifier corresponding to the third memory section 111. The first control unit 51 and the second control unit 52 are both disposed between the first memory sub-bank 11 and the second memory sub-bank 12.

In some embodiments, the memory circuit further includes a fourth switch circuit 34 configured to connect the first control unit 51 and the first sense amplifier 141, a fifth switch circuit 35 configured to connect the first control unit 51 and the third sense amplifier 43, and a sixth switch circuit 36 configured to connect the second control unit 52 and the fourth sense amplifier 44. The fifth switch circuit 35 and the sixth switch circuit 36 are configured to receive the first flag signal 41 and be turned on, the fourth switch circuit 34 is configured to receive the second flag signal 42 and be turned on. The first flag signal 41 is indicative of reading the upper bytes, and the second flag signal is indicative of reading the lower bytes. Similarly to the setting of the switch circuit described above, the first control unit 51 is connected to the corresponding sense amplifier at the corresponding timing by setting the switch circuit, so that it is advantageous to ensure that the first control unit 51 is ready to control the corresponding sense amplifier, thus accurately amplify the minute readout signal on the corresponding bit line, and ensure the accuracy of data readout of the memory circuit.

In some embodiments, the memory circuit further includes a third row decoder 23 disposed between the first memory section 121 and the fifth memory section 131, a fourth row decoder 24 disposed between the second memory section 122 and the sixth memory section 132. The third row decoder 23 is configured to activate word lines in the fifth memory section 131, and the fourth row decoder 24 is configured to activate word lines in the second memory section 122 and the sixth memory section 132.

Accordingly, the memory circuit further includes a fifth sense amplifier 45 configured to amplify the readout signal of a bit line in the fifth memory section 131 and a sixth sense amplifier 46 configured to amplify the readout signal of a bit line in the sixth memory section 132. Furthermore, the memory circuit includes a third control unit 53 and a fourth control unit 54. The third control unit 53 is connected to the fifth sense amplifier 45 through a corresponding switch circuit to adjust the fifth sense amplifier 45 when the memory circuit reads the lower bytes, and the fourth control unit 54 is respectively connected to the second sense amplifier 142 and the sixth sense amplifier 46 through different switch circuits, to adjust the second sense amplifier 142 when the upper bytes are read and adjust the sixth sense amplifier 46 when the lower bytes are read.

Figure 4:
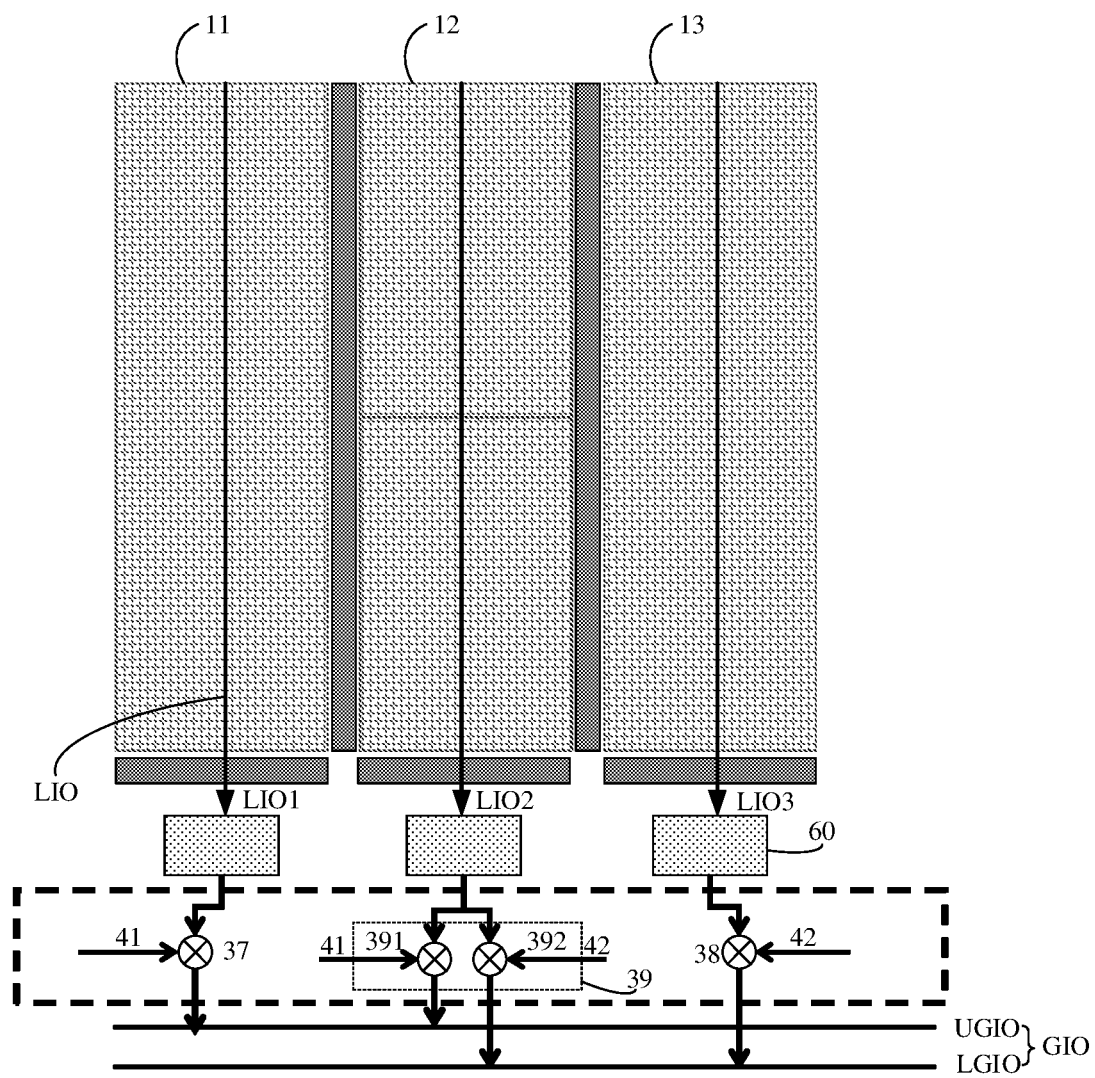

In some embodiments, referring to FIG. 4, the memory circuit further includes local input/output (I/O) lines LIO, primary amplifiers 60 and a global I/O line GIO, where each I/O line LIO is configured to transmit a readout signal amplified by a respective sense amplifier; and each primary amplifier 60 is configured to receive the readout signal output by the local I/O line LIO and amplify the readout signal, and transmit the readout signal amplified again to the global I/O line GIO.

It can be understood that each local I/O line LIO corresponds to one bit line. The number of bit lines in each memory bank 10 is identical to the number of columns of the memory array in the memory bank 10. That is to say, the more the number of columns of the memory array is, the more the number of bit lines in the memory bank is. Similarly, the number of bit lines in each memory sub-bank is identical to the number of columns of the memory array in the memory sub-bank. In addition, each local I/O line LIO corresponds to a primary amplifier 60; the primary amplifier 60 is configured to receive the readout signal output by the corresponding local I/O line LIO and amplify the readout signal, and the primary amplifier 60 is connected to the corresponding global I/O line GIO according to the type of the bytes stored in the memory sub-bank.

Among the multi-byte data, the byte is divided into upper bytes and lower bytes. To ensure the accuracy of data readout, the upper bytes are generally transmitted by the upper global I/O line UGIO, and the lower bytes are transmitted by the lower global I/O line LGIO. In some embodiments, the first memory sub-bank 11, the second memory sub-bank 12, and the third memory sub-bank 13 each includes 128 bit lines. The global I/O line GIO is configured to transmit sixteen bytes of data, where the first eight bytes are upper bytes and the last eight bytes are lower bytes. Since each byte includes eight bits, the global I/O line GIO is configured to transmit 128 bits of data.

The local I/O line LIO includes a first local I/O line LIO1 connected to the first memory sub-bank 11 and a third local I/O line LIO3 connected to the third memory sub-bank 13. The global I/O lines include an upper global I/O line UGIO and a lower global I/O line LGIO. The memory circuit further includes: a seventh switch circuit 37 configured to connect the first local I/O line LIO1 and the upper global I/O line UGIO, and receive the first flag signal 41 and be turned on; and an eighth switch circuit 38 configured to connect the third local I/O line LIO3 and the lower global I/O line LGIO, and receive the second flag signal 42 and be turned on.

In addition, the local I/O lines further include a second local I/O line LIO2 connected to the second memory sub-bank 12. The memory circuit further includes: a selector 39 having one end connected to the second local I/O line LIO2 and configured to receive the first flag signal 41 or the second flag signal 42, in response to receiving the first flag signal 41, the selector is configured to connect the second local I/O line LIO2 and the upper global I/O line UGIO, and in response to receiving the second flag signal 42, the selector is configured to connect the second local I/O line LIO2 and the lower global I/O line LGIO.

In some embodiments, the primary I/O line and the cross-point region circuit XP are connected in series between the local I/O line LIO and the primary amplifier 60, after the readout signal is amplified by the sense amplifier and amplified readout signal is activated by the column selection signal, the activated amplified readout signal is then sequentially transmitted to the local I/O line LIO, the cross-point region circuit, the primary I/O line and the primary amplifier 60. After the primary amplifier 60 amplifies the readout signal again, the amplified readout signal is transmitted to data terminal sequentially through the receiving amplifier, the multiplexer and the output buffer. The receiving amplifier is activated by a corresponding start signal to amplify the minute signal generated on the global I/O line. The multiplexer is a parallel-to-serial conversion circuit that transmits multiple pieces of stored information simultaneously read out from the memory array to the output buffer in time sequence, and the output sequence is controlled by the corresponding data output start signal.

Accordingly, in the write operation, a data signal to be stored is input from the data terminal and transmitted to the input buffer together with the data input start signal, and the data input into the input buffer is transmitted to the word line driver via the de-multiplexer, the global write driver, and the global I/O line GIO. Correspondingly, the de-multiplexer is a circuit that performs serial-to-parallel conversion on the data information continuously input in time sequence. The correspondences between the input data signals and the global I/O line GIO are controlled by the data input start signal, so as to be consistent with the output sequence in the read operation.

Specifically, the selector 39 may include a first switch 391 and a second switch 392. One end of each of the first switch 391 and the second switch 392 is connected to the primary amplifier 60 to receive the readout signal amplified again, the other end of the first switch 391 is connected to the upper global I/O line UGIO and configured to receive the first flag signal 41 and be turned on, and the other end of the second switch 392 is connected to the lower I/O line LGIO and configured to receive the second flag signal 42 and be turned on.

In the embodiment of the present disclosure, three memory sub-banks are arranged side by side, the memory sub-bank in the middle position can share the same row decoder with the adjacent memory sub-banks, and it is not necessary to introduce additional row decoders, so that it is advantageous to increase the capacity of the memory bank with a smaller circuit area without increasing the number of memory segments in the memory sub-bank. In addition, the second memory sub-bank in the middle position is configured to store the upper bytes and the lower bytes, and the memory sub-bank on both sides is configured to store the upper bytes or the lower bytes. In this way, it is impossible to make the memory segment storing the upper bytes to share the same row decoder with the memory segment storing the lower bytes, thereby avoiding the shared row decoder from activating the erroneous word line, and improving the readout accuracy of the memory circuit.

Embodiments of the present disclosure further provide a memory including the above-described memory circuit. The memory including the above-described memory circuit may have a small volume and a large capacity to ensure the efficient operation of the package test.

Those of ordinary skill in the art can understand that each embodiment is a specific embodiment implementing the disclosure, and in practical applications, various variations about the form and details can be made thereto without departing from the spirit and scope of the disclosure. Those skilled in the art may make respective alterations and modifications without departing from the spirit and scope of the present disclosure, so the protection scope of the disclosure is subject to the protection scope in claims.

INDUSTRIAL PRACTICABILITY

Embodiments of the present disclosure relate to the semiconductor field, and a memory circuit and a memory are provided. The memory circuit may at least include a plurality of memory banks, each of the memory banks includes a first memory sub-bank, a second memory sub-bank and a third memory sub-bank sequentially arranged, the second memory sub-bank including a first memory section and a second memory section, the first memory sub-bank and the second memory section being configured to store upper bytes, and the first memory section and the third memory sub-bank being configured to store lower bytes. Embodiments of the present disclosure are advantageous to improve integration and capacity of the memory circuit without changing an external size of the circuit.

The invention claimed is:

1. A memory circuit, comprising:
a plurality of memory banks, wherein each of the memory banks comprises a first memory sub-bank, a second memory sub-bank and a third memory sub-bank sequentially arranged, the second memory sub-bank comprising a first memory section and a second memory section, the first memory sub-bank and the second memory section being configured to store upper bytes, and the first memory section and the third memory sub-bank being configured to store lower bytes.

2. The memory circuit of claim 1, wherein a number of memory segments in the first memory sub-bank is identical to a number of memory segments in the third memory sub-bank, and a number of memory segments in the first memory section is identical to a number of memory segments in the second memory section.

3. The memory circuit of claim 2, wherein a sum of the number of memory segments in the first memory section and the number of memory segments in the second memory section is equal to the number of memory segments in the first memory sub-bank.

4. The memory circuit of claim 2, wherein the memory segments storing the upper bytes comprise a number of word lines identical to a number of word lines comprised in the memory segments storing the lower bytes.

5. The memory circuit of claim 1, wherein the first memory sub-bank comprises a third memory section and a fourth memory section, and the third memory sub-bank comprises a fifth memory section and a sixth memory section, the third memory section, the first memory section and the fifth memory section being arranged side by side, and the fourth memory section, the second memory section, and the sixth memory section being arranged side by side, wherein the third memory section comprises a number of word lines identical to a number of word lines comprised in the first memory section, and the second memory section comprises a number of word lines identical to a number of word lines comprised in the sixth memory section.

6. The memory circuit of claim 5, comprising a first row decoder disposed between the third memory section and the first memory section, and a second row decoder disposed between the fourth memory section and the second memory section, wherein the first row decoder is configured to activate word lines in the third memory section and the first memory section, and the second row decoder is configured to activate word lines in the fourth memory section.

7. The memory circuit of claim 6, further comprising: a first switch circuit configured to connect the first row decoder and the third memory section, a second switch circuit configured to connect the second row decoder and the fourth memory section, and a third switch circuit configured to connect the first row decoder and the first memory section, wherein the first switch circuit and the second switch circuit are configured to receive a first flag signal and be turned on, and the third switch circuit is configured to receive a second flag signal and be turned on, the first flag signal being indicative of reading the upper bytes and the second flag signal being indicative of reading the lower bytes.

8. The memory circuit of claim 5, further comprising:
a first sense amplifier configured to amplify a readout signal of a bit line in the first memory section, a second sense amplifier configured to amplify a readout signal of a bit line in the second memory section, a third sense amplifier configured to amplify a readout signal of a bit line in the third memory section, and a fourth sense amplifier configured to amplify a readout signal of a bit line in the fourth memory section; and
a first control unit disposed between the first sense amplifier and the third sense amplifier, and a second control unit disposed between the second sense amplifier and the fourth sense amplifier, wherein the first control unit is configured to control the first sense amplifier and the third sense amplifier, and the second control unit is configured to control the fourth sense amplifier.

9. The memory circuit of claim 8, further comprising: a fourth switch circuit configured to connect the first control unit and the first sense amplifier, a fifth switch circuit configured to connect the first control unit and the third sense amplifier, and a sixth switch circuit configured to connect the second control unit and the fourth sense amplifier, wherein the fifth switch circuit and the sixth switch circuit are configured to receive a first flag signal and be turned on, and the fourth switch circuit is configured to receive a second flag signal and be turned on, the first flag signal being indicative of reading the upper bytes, and the second flag signal being indicative of reading the lower bytes.

10. The memory circuit of claim 8, wherein both the first control unit and the second control unit are disposed between the first memory sub-bank and the second memory sub-bank.

11. The memory circuit of claim 5, comprising: a third row decoder disposed between the first memory section and the fifth memory section, and a fourth row decoder disposed between the second memory section and the sixth memory section, wherein the third row decoder is configured to activate word lines in the fifth memory section, and the fourth row decoder is configured to activate word lines in the second memory section and the sixth memory section.

12. The memory circuit of claim 1, further comprising local input/output (I/O) lines, primary amplifiers and a global I/O line, wherein each I/O line is configured to transmit a readout signal amplified by a respective sense amplifier; and each primary amplifier is configured to receive the readout signal output by the local I/O line and amplify the readout signal, and transmit the readout signal amplified again to the global I/O line.

13. The memory circuit of claim 12, wherein the local I/O lines comprise a first local I/O line connected to the first memory sub-bank and a third local I/O line connected to the third memory sub-bank, and the global I/O lines comprise a upper global I/O line and a lower global I/O line, wherein the memory circuit further comprises:
a seventh switch circuit configured to connect the first local I/O line and the upper global I/O line, and receive a first flag signal and be turned on, wherein the first flag signal is indicative of reading the upper bytes; and
an eighth switch circuit configured to connect the third local I/O line and the lower global I/O line, and receive a second flag signal and be turned on, wherein the second flag signal is indicative of reading the lower bytes.

14. The memory circuit of claim 13, wherein the local I/O lines further comprise a second local I/O line connected to the second memory sub-bank, wherein the memory circuit further comprises:
a selector having one end connected to the second local I/O line and configured to receive the first flag signal or the second flag signal, wherein in response to receiving the first flag signal, the selector is configured to connect the second local I/O line and the upper global I/O line, and in response to receiving the second flag signal, the selector is configured to connect the second local I/O line and the lower global I/O line.

15. A memory, comprising a memory circuit, wherein the memory circuit comprises:
a plurality of memory banks, wherein each of the memory banks comprises a first memory sub-bank, a second memory sub-bank and a third memory sub-bank sequentially arranged, the second memory sub-bank comprising a first memory section and a second memory section, the first memory sub-bank and the second memory section being configured to store upper bytes, and the first memory section and the third memory sub-bank being configured to store lower bytes.

* * * * *